United States Patent
Endo et al.

(10) Patent No.: US 9,212,255 B2
(45) Date of Patent: Dec. 15, 2015

(54) RESIST UNDERLAYER FILM-FORMING COMPOSITION

(71) Applicant: NISSAN CHEMICAL INDUSTRIES, LTD., Tokyo (JP)

(72) Inventors: Takafumi Endo, Toyama (JP); Rikimaru Sakamoto, Toyama (JP); Noriaki Fujitani, Toyama (JM)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/399,702

(22) PCT Filed: Apr. 26, 2013

(86) PCT No.: PCT/JP2013/062406
§ 371 (c)(1),
(2) Date: Nov. 7, 2014

(87) PCT Pub. No.: WO2013/168610
PCT Pub. Date: Nov. 14, 2013

(65) Prior Publication Data
US 2015/0087155 A1     Mar. 26, 2015

(30) Foreign Application Priority Data

May 7, 2012     (JP) .................................. 2012-106226

(51) Int. Cl.
| C08G 63/00 | (2006.01) |
| H01L 21/308 | (2006.01) |
| G03F 7/11 | (2006.01) |
| G03F 7/09 | (2006.01) |

(52) U.S. Cl.
CPC ................ *C08G 63/00* (2013.01); *G03F 7/091* (2013.01); *G03F 7/11* (2013.01); *H01L 21/3081* (2013.01); *H01L 21/3085* (2013.01)

(58) Field of Classification Search
None
See application file for complete search history.

(56) References Cited

U.S. PATENT DOCUMENTS

| 7,560,588 | B2 * | 7/2009 | Breitenkamp et al. ......... 560/160 |
| 2004/0142275 | A1 * | 7/2004 | Komatsu ..................... 430/270.1 |
| 2012/0183903 | A1 * | 7/2012 | Hatakeyama et al. ...... 430/284.1 |
| 2014/0287589 | A1 * | 9/2014 | Endo et al. .................... 438/694 |
| 2015/0031206 | A1 * | 1/2015 | Endo et al. .................... 438/694 |

FOREIGN PATENT DOCUMENTS

| JP | 2006-282814 A | * | 10/2006 |
| JP | 2007513491 A |   | 5/2007 |
| JP | 2007233386 A |   | 9/2007 |
| JP | 2009103831 A |   | 5/2009 |
| JP | 2009175436 A |   | 8/2009 |
| JP | 2010-181453 A | * | 8/2010 |
| WO | 03017002 A1 |   | 2/2003 |
| WO | 2008062888 A1 |   | 5/2008 |
| WO | 2013058189 A1 |   | 4/2013 |

OTHER PUBLICATIONS

English translation of JP, 2006-282814, A (2006) from machine translation from AIPN Japan Patent Office National Center for Industrial Property Information and Training, generated Feb. 7, 2015, 21 pages.*
Chiu et al, "Synthesis Functional Poly(carbonate-b-ester) Copolymers and Micellar Characterizations", Journal of Applied Polymer Science, vol. 106, pp. 283-292, published online Jun. 11, 2007.*
Jul. 2, 2013 Written Opinion issued in International Application No. PCT/JP2013/062406.
Jul. 2, 2013 Search Report issued in International Application No. PCT/JP2013/062406.
Oct. 1, 2015 Office Action issued in U.S. Appl. No. 14/835,209.

* cited by examiner

*Primary Examiner* — Cynthia Hamilton
(74) *Attorney, Agent, or Firm* — Oliff PLC

(57) ABSTRACT

A composition forms a resist underlayer film showing improved adhesiveness to a resist pattern. A resist underlayer film-forming composition for lithography, including: a polymer that has a structure of Formula (1a), Formula (1b), or Formula (2) below on an end of the polymer; and an organic solvent:

$$-O-\left(\underset{\text{O}}{\overset{\text{O}}{\overset{\|}{C}}}\right)_v\left(\underset{R_3}{\overset{R_2}{\overset{|}{C}}}\right)_y-N-\overset{\text{O}}{\overset{\|}{C}}-O-\underset{CH_3}{\overset{CH_3}{\overset{|}{C}}}-CH_3 \quad (1a)$$

$$-O-\overset{\text{O}}{\overset{\|}{C}}-\underset{R_4}{\overset{}{\bigtriangleup}}_{x_1}{\overset{}{\bigtriangleup}}_{x_2}-N-\overset{\text{O}}{\overset{\|}{C}}-O-\underset{CH_3}{\overset{CH_3}{\overset{|}{C}}}-CH_3 \quad (2)$$

$$O-\left(\overset{\text{O}}{\overset{\|}{C}}\right)_v-Q_1-\left(\overset{R_1}{\overset{|}{N}}-\overset{\text{O}}{\overset{\|}{C}}-O-\underset{CH_3}{\overset{CH_3}{\overset{|}{C}}}-CH_3\right)_w \quad (1b)$$

(where $R_1$ is a hydrogen atom or a methyl group; each of $R_2$ and $R_3$ is independently a hydrogen atom or an organic group such as a hydrocarbon group, etc., the hydrocarbon group optionally has at least one of a hydroxy group and a methylthio group as substituent(s); $R_4$ is a hydrogen atom or a hydroxy group; $Q_1$ is an arylene group; v is 0 or 1; y is an integer of 1 to 4; w is an integer of 1 to 4; $x_1$ is 0 or 1; and $x_2$ is an integer of 1 to 5).

13 Claims, No Drawings

RESIST UNDERLAYER FILM-FORMING COMPOSITION

TECHNICAL FIELD

The present invention relates to a resist underlayer film showing improved adhesiveness to a resist pattern in a lithography process, and to a composition for forming a resist underlayer film that is useful to form a resist pattern in a desired shape on the resist underlayer film. The present invention further relates to a method for manufacturing semiconductor elements by using the composition.

BACKGROUND ART

In ArF liquid immersion lithography and extreme ultraviolet (EUV) lithography, processing dimensions of resist line widths have been required to be finer. In formations of such fine resist patterns, the smaller the contact area between a resist pattern and a ground is, the larger the aspect ratio (the height of the resist pattern/the line width of the resist pattern) is, which is likely to cause collapse of the resist pattern. Thus, a resist underlayer film (anti-reflective coating) that is in contact with a resist pattern has been required to be highly adhesive to the resist pattern in order to avoid collapse of the resist pattern.

A resist underlayer film-forming composition has been disclosed that employs a lactone structure as a structural component for achieving high adhesiveness to a resist pattern. A resist underlayer film formed with the composition has improved adhesiveness to a resist pattern to be obtained (Patent Document 1). In other words, by using a structure having a polar moiety such as a lactone structure as a structural component of a resist underlayer film-forming composition, adhesiveness to a resist pattern is expected to be improved, and collapse of a resist pattern is expected to be prevented even in a fine resist pattern.

Unfortunately, in a lithography process requiring formation of much finer resist patterns, such as ArF liquid immersion lithography and extreme ultraviolet (EUV) lithography, containing only a lactone structure in a resist underlayer film-forming composition as a structural component does not sufficiently prevent collapse of a resist pattern.

PRIOR ART DOCUMENT

Patent Document

Patent Document 1: International Publication No. 03/017002 (WO 03/017002)

SUMMARY OF THE INVENTION

Problem to be Solved by the Invention

A method for controlling the chemical state of the interface between a resist and a resist underlayer film is one example of methods to obtain high adhesiveness to resist patterns. Specifically, in a positive-type resist, when the chemical state of the interface between a resist and a resist underlayer film is acidic, the shape of a resist pattern to be obtained is an undercut, and an area in contact with the resist pattern extremely decreases, which is likely to cause collapse of the resist pattern. In contrast, when the chemical state of the interface between a resist and a resist underlayer film is basic, the shape of a resist pattern can be prevented from being an undercut, and thus stronger adhesiveness to the resist pattern can be expected, compared to adhesiveness to a resist pattern obtained by introducing a polar moiety such as a lactone structure.

Accordingly, it is an object of the present invention to provide a resist underlayer film-forming composition that enhances adhesiveness between a resist pattern to be formed on a resist underlayer film and the resist underlayer film, and that reforms the state of the surface of a resist underlayer film to be basic so that an undercut of the resist pattern is suppressed.

Means for Solving the Problem

The present invention provides, as a first aspect, a resist underlayer film-forming composition for lithography, comprising: a polymer that has a structure of Formula (1a), Formula (1b), or Formula (2) below on an end of the polymer; and an organic solvent:

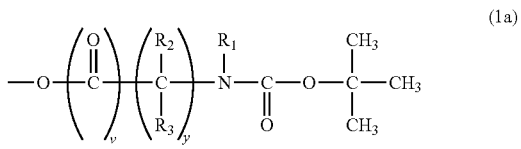

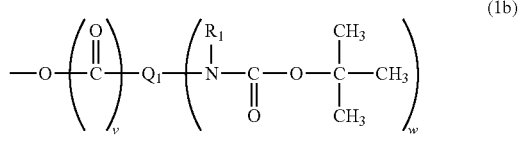

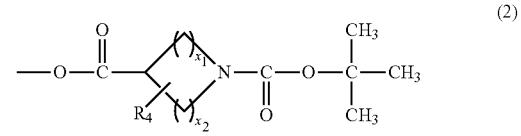

(where $R_1$ is a hydrogen atom or a methyl group; each of $R_2$ and $R_3$ is independently a hydrogen atom, a linear or branched hydrocarbon group having a carbon atom number of 1 to 6, an alicyclic hydrocarbon group, a phenyl group, a benzyl group, a benzyloxy group, a benzylthio group, an imidazole group, or an indole group; each of the hydrocarbon group, the alicyclic hydrocarbon group, the phenyl group, the benzyl group, the benzyloxy group, the benzylthio group, the imidazole group, and the indole group optionally has at least one of a hydroxy group and a methylthio group as substituent(s); $R_4$ is a hydrogen atom or a hydroxy group; $Q_1$ is an arylene group; v is 0 or 1; y is an integer of 1 to 4; w is an integer of 1 to 4; $x_1$ is 0 or 1; and $x_2$ is an integer of 1 to 5).

For example, the structure of Formula (1b) is Formula (3):

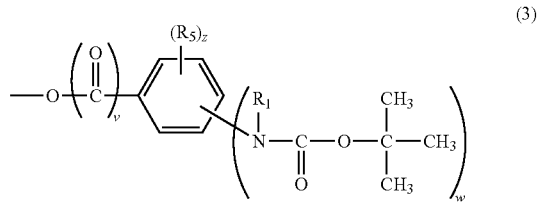

[where $R_1$ is as defined in Formula (1b); each $R_5$ is independently a hydrogen atom, a linear or branched hydrocarbon group having a carbon atom number of 1 to 6, a $C_{1-4}$ alkoxy group, a $C_{1-4}$ alkylthio group, a halogen atom, a cyano group, or a nitro group; v and w are as defined in Formula (1b); and z is an integer of (5-w)].

The polymer may further have at least one of structure units represented by Formula (4) in a main chain of the polymer:

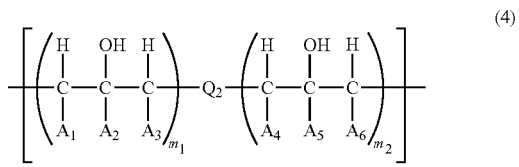
(4)

(where each of $A_1$, $A_2$, $A_3$, $A_4$, $A_5$, and $A_6$ is independently a hydrogen atom, a methyl group, or an ethyl group; $Q_2$ is a divalent organic group; and each of $m_1$ and $m_2$ is independently 0 or 1).

In Formula (4), $Q_2$ is a divalent organic group of Formula (5), for example:

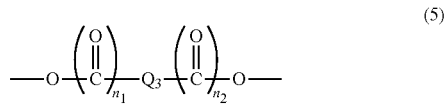
(5)

(where $Q_3$ is a divalent organic group having at least one of a $C_{1-10}$ alkylene group, a $C_{2-6}$ alkenylene group, a $C_{3-10}$ alicyclic hydrocarbon ring, and a $C_{6-14}$ aromatic hydrocarbon ring; the divalent organic group is optionally substituted with at least one selected from the group consisting of a $C_{1-6}$ alkyl group, a halogen atom, a hydroxy group, a $C_{1-6}$ alkoxy group, a $C_{2-6}$ alkoxycarbonyl group, a nitro group, a cyano group, and a $C_{1-6}$ alkylthio group; when the divalent organic group has two alkylene groups, two alicyclic hydrocarbon rings, or two aromatic hydrocarbon rings, the two alkylene groups, the two alicyclic hydrocarbon rings, or the two aromatic hydrocarbon rings are optionally bonded to each other through a linking group selected from the group consisting of a sulfonyl group, a disulfide group, a sulfide group, a carbonyl group, a —C(=O)O— group, an —O— group, a —C(CH$_3$)$_2$— group, and a —C(CF$_3$)$_2$— group; and each of $n_1$ and $n_2$ is independently 0 or 1).

Examples of the hydrocarbon group in the present specification include a saturated hydrocarbon group such as an alkyl group, or an unsaturated hydrocarbon group.

Examples of the alkyl group in the present specification include a methyl group, an ethyl group, a propyl group, and an isopropyl group; and examples of the halogen atom include a fluorine atom, a chlorine atom, a bromine atom, and an iodine atom. Examples of the arylene group include a phenylene group, a naphthylene group, and an anthrylene group. Examples of the alkoxy group include a methoxy group, an ethoxy group, a propoxy group, an isopropoxy group, a butoxy group, an isobutoxy group, a sec-butoxy group, and a tert-butoxy group. Examples of the alkylene group include a methylene group, an ethylene group, a propylene group, a trimethylene group, a tetramethylene group, a pentamethylene group, and a hexamethylene group. Examples of the alkenylene group include a —CH=CH— group. Examples of the alicyclic hydrocarbon ring include a cyclopropane ring, a cyclobutane ring, a cyclopentane ring, and a cyclohexane ring; and examples of the alicyclic hydrocarbon group include a cyclopropyl group, a cyclobutyl group, a cyclopentyl group, and a cyclohexyl group. Examples of the aromatic hydrocarbon ring include a benzene ring, a naphthalene ring, and an anthracerne ring. When the divalent organic group has two alkylene groups, two alicyclic hydrocarbon rings, or two aromatic hydrocarbon rings, the two alkylene groups, the two alicyclic hydrocarbon rings, or the two aromatic hydrocarbon rings are optionally bonded to each other through a linking group such as a sulfonyl group, a disulfide group, a sulfide group, a carbonyl group, a —C(=O)O— group, an —O— group, a —C(CH$_3$)$_2$— group, and a —C(CF$_3$)$_2$— group. Examples of the alkenyl group that will be described later include an allyl group.

In Formula (4), $Q_2$ is represented also by a divalent organic group of Formula (6):

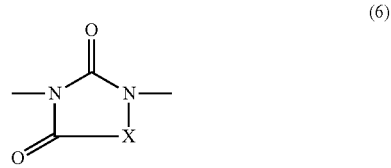
(6)

(where X is a divalent organic group of Formula (7) or Formula (8):

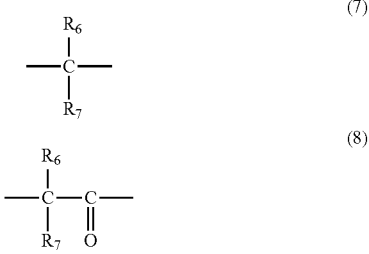
(7)

(8)

(where each of $R_6$ and $R_7$ is independently a hydrogen atom, a $C_{1-6}$ alkyl group, a $C_{3-6}$ alkenyl group, a benzyl group, or a phenyl group, in which the phenyl group is optionally substituted with at least one selected from the group consisting of a $C_{1-6}$ alkyl group, a halogen atom, a $C_{1-6}$ alkoxy group, a nitro group, a cyano group, and a $C_{1-6}$ alkylthio group; or $R_6$ and $R_7$ are optionally bonded to each other to form a $C_{3-6}$ ring, together with a carbon atom bonded to $R_6$ and $R_7$)).

In Formula (4), $Q_2$ is represented also by a divalent organic group of Formula (9):

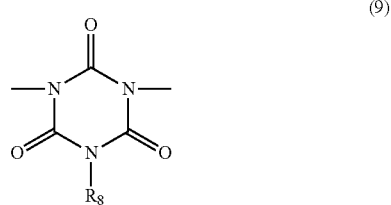
(9)

(where $R_8$ is a $C_{1-6}$ alkyl group, a $C_{3-6}$ alkenyl group, a benzyl group, or a phenyl group, in which the phenyl group is optionally substituted with at least one selected from the group consisting of a $C_{1-6}$ alkyl group, a halogen atom, a $C_{1-6}$ alkoxy group, a nitro group, a cyano group, and a $C_{1-6}$ alkylthio group).

The resist underlayer film-forming composition according to the first aspect of the present invention may further comprise a cross-linker and a cross-linking catalyst.

The present invention provides, as a second aspect, a method for producing a semiconductor element, the method comprising: applying the resist underlayer film-forming composition according to the first aspect of the present invention onto a substrate having a film to be processed; baking the applied resist underlayer film-forming composition to form a resist underlayer film; covering the resist underlayer film with a resist; irradiating the substrate covered with the resist with a KrF excimer laser, an ArF excimer laser, an extreme ultraviolet, or an electron beam; forming a resist pattern by development; and patterning the film to be processed by dry etching using the resist pattern as a mask.

Effects of the Invention

A resist underlayer film-forming composition for lithography of the present invention is characterized by comprising a polymer that has a structure of Formula (1a), Formula (1b), or Formula (2) on an end of the polymer, and whereby the end of the polymer is capped with the structure. Applying such a resist underlayer film-forming composition to a lithography process effectively suppresses collapse of a resist pattern with a fine line width formed on a resist underlayer film prepared with the composition.

MODES FOR CARRYING OUT THE INVENTION

A resist underlayer film-forming composition for lithography of the present invention includes a polymer having a structure of Formula (1a), Formula (1b), or Formula (2) on an end of the polymer. A weight-average molecular weight of the polymer is, for example, 2,000 to 50,000.

Examples of the monomer constituting the end of the polymer include compounds of Formula (11-a) to Formula (11-o).

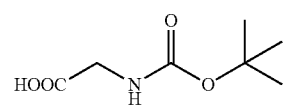
(11-a)

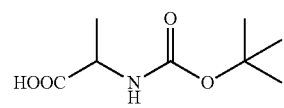
(11-b)

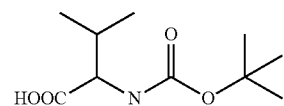
(11-c)

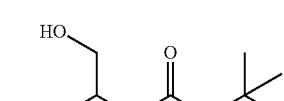
(11-d)

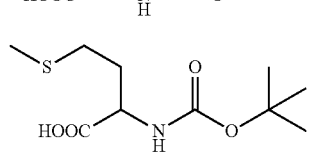
(11-e)

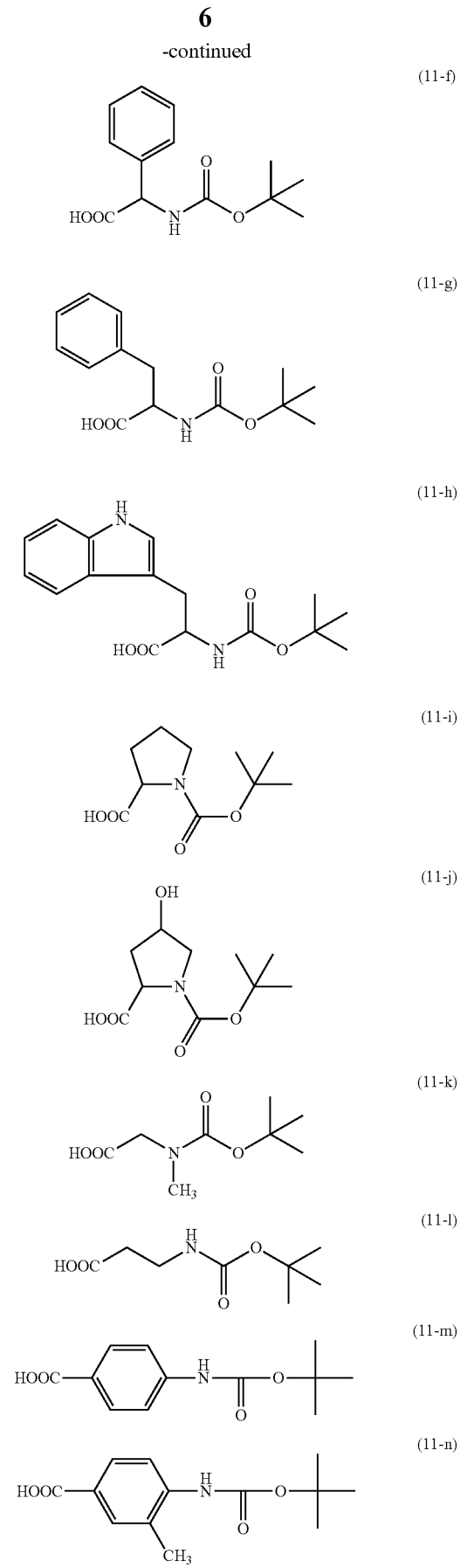

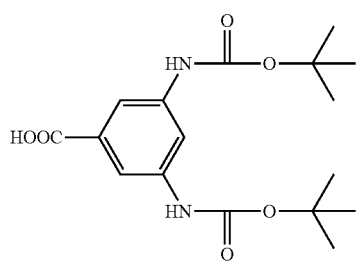
(11-o)

The polymer can be obtained by, for example, causing a polymer having an epoxy group on its end to react with a monomer reactive with the epoxy group. Examples of such a monomer include N-(tert-butoxycarbonyl)glycine, N-(tert-butoxycarbonyl)alanine, N-(tert-butoxycarbonyl)valine, N-(tert-butoxycarbonyl)leucine, N-(tert-butoxycarbonyl) isoleucine, N-(tert-butoxycarbonyl)methionine, N-(tert-butoxycarbonyl)serine, N-(tert-butoxycarbonyl)threonine, N-(tert-butoxycarbonyl)proline, N-(tert-butoxycarbonyl)histidine, N-(tert-butoxycarbonyl)phenylalanine, N-(tert-butoxycarbonyl)tyrosine, N-(tert-butoxycarbonyl)tryptophan, O-benzyl-N-(tert-butoxycarbonyl)serine, N-(tert-butoxycarbonyl)aspartic acid 4-benzyl ester, N-(tert-butoxycarbonyl) glutamic acid 5-benzyl ester, N-(tert-butoxycarbonyl)asparagine, N-(tert-butoxycarbonyl)-S-benzylcysteine, N-(tert-butoxycarbonyl)-O-benzylthreonine, N-(tert-butoxycarbonyl)-O-benzyltyrosine, N-(tert-butoxycarbonyl)-O-tert-butyltyrosine, N-(tert-butoxycarbonyl)-N-carbobenzoxylysine, N-(tert-butoxycarbonyl)-3,4-difluorophenylalanine, N-(tert-butoxycarbonyl)-4-fluorophenylalanine, N-(tert-butoxycarbonyl)-N1-formyltryptophan, N-(tert-butoxycarbonyl)glutamine, N-(tert-butoxycarbonyl)-4-hydroxyproline, N-(tert-butoxycarbonyl)-4-nitrophenylalanine, N-(tert-butoxycarbonyl)-(para-toluenesulfonylhistidine), N-methyl-N-(tert-butoxycarbonyl)glycine, N-(tert-butoxycarbonyl)-f-alanine, 4-(tert-butoxycarbonyl)aminobenzoic acid, 4-(tert-butoxycarbonyl)amino-3-methylbenzoic acid, and 3,5-bis(tert-butoxycarbonyl)aminobenzoic acid. Among them, N-(tert-butoxycarbonyl)glycine, N-(tert-butoxycarbonyl)leucine, N-(tert-butoxycarbonyl)serine, N-(tert-butoxycarbonyl)proline, N-(tert-butoxycarbonyl)-4-hydroxyproline, and 4-(tert-butoxycarbonyl)aminobenzoic acid are preferable, and N-(tert-butoxycarbonyl)proline is particularly preferable.

Examples of the monomer of Formula (4) that forms a structural unit in which each of $m_1$ and $m_2$ is 1 include, but not limited to, compounds of Formula (12-a) to Formula (12-k) below each having two epoxy groups.

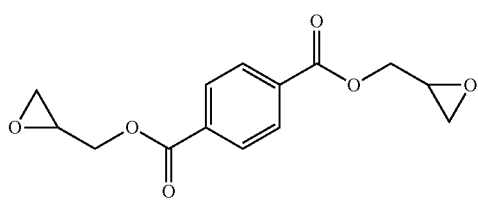
(12-a)

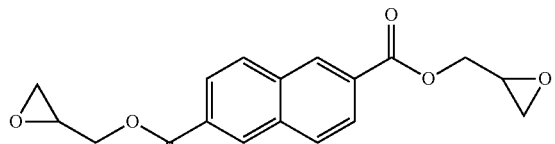
(12-b)

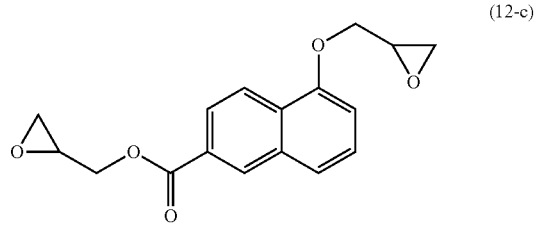
(12-c)

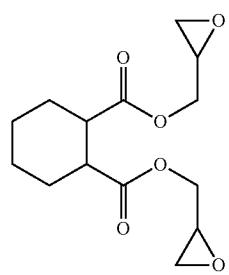
(12-d)

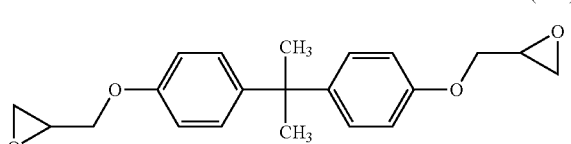
(12-e)

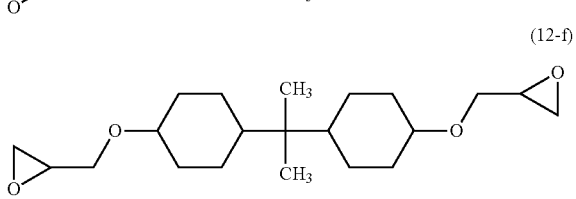
(12-f)

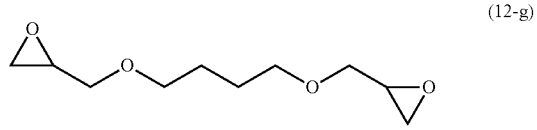
(12-g)

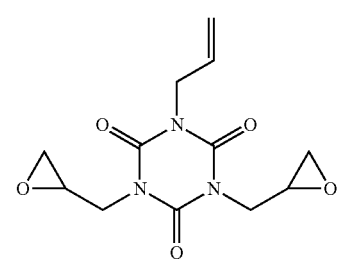
(12-h)

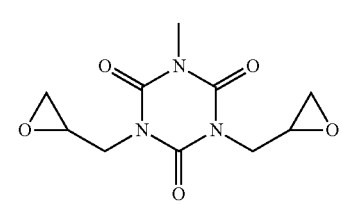
(12-i)

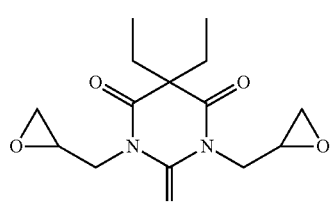
(12-j)

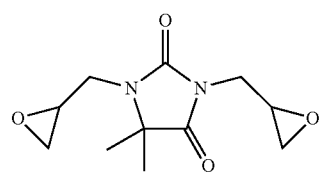
(12-k)

Specifically, the examples include 1,4-terephthalic acid diglycidyl ester, 2,6-naphthalenedicarboxylic acid diglycidyl ester, 1,6-dihydroxynaphthalene diglycidyl ether, 1,2-cyclohexanedicarboxylic acid diglycidyl ester, 2,2-bis(4-hydroxyphenyl)propane diglycidyl ether, 2,2-bis(4-hydroxycyclohexane)propane diglycidyl ether, 1,4-butanediol diglycidyl ether, monoallylisocyanuric acid diglycidyl ester, monomethylisocyanuric acid diglycidyl ester, 5,5-diethylbarbituric acid diglycidyl ester, and 5,5-dimethylhydantoin diglycidyl ether.

Examples of the monomer of Formula (4) that forms a structural unit in which each of $m_1$ and $m_2$ is 0 include, but not limited to, compounds of Formula (13-a) to Formula (13-s) below that are compounds each having two carboxy groups, two hydroxy groups, or two imido groups, compounds each having at least one carboxy group and at least one hydroxy group, and a dianhydride.

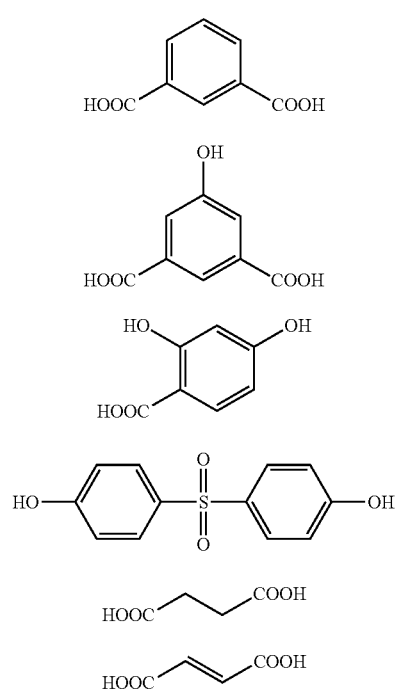

(13-a)

(13-b)

(13-c)

(13-d)

(13-e)

(13-f)

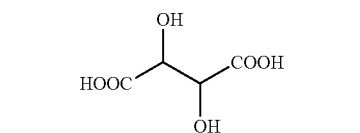
(13-g)

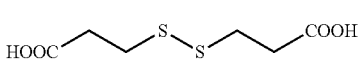
(13-h)

(13-i)

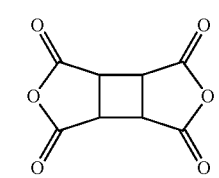
(13-j)

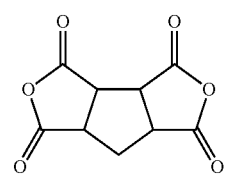
(13-k)

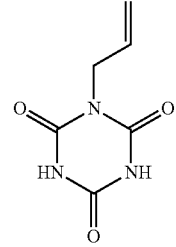
(13-l)

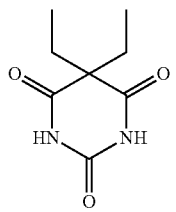
(13-m)

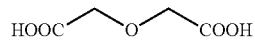
(13-n)

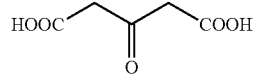
(13-o)

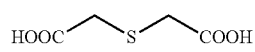
(13-p)

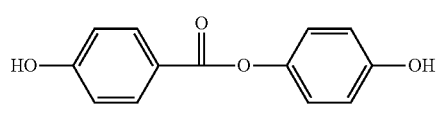
(13-q)

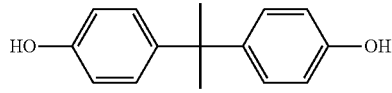
(13-r)

-continued

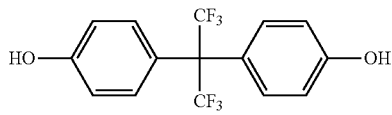
(13-s)

Specifically, the examples include isophthalic acid, 5-hydroxyisophthalic acid, PP-2,4-dihydroxybenzoic acid, 2,2-bis(4-hydroxyphenyl)sulfone, succinic acid, fumaric acid, tartaric acid, 3,3'-dithiodipropionic acid, 1,4-cyclohexanedicarboxylic acid, cyclobutanoic acid dianhydride, cyclopentanoic acid dianhydride, monoallylisocyanuric acid, 5,5-diethylbarbituric acid, diglycolic acid, acetonedicarboxylic acid, 2,2'-thiodiglycolic acid, 4-hydroxybenzoic acid-4-hydroxyphenyl ester, 2,2-bis(4-hydroxyphenyl)propane, and 2,2-bis(4-hydroxyphenyl)hexafluoropropane.

The number of repetitions of the structural unit of Formula (4) is, for example, 10 to 10,000.

Examples of the polymer having at least one of the structural units represented by Formula (4), and having a structure of Formula (1a), Formula (1b), or Formula (2) on an end of the polymer are represented by Formula (14-a) to Formula (14-f):

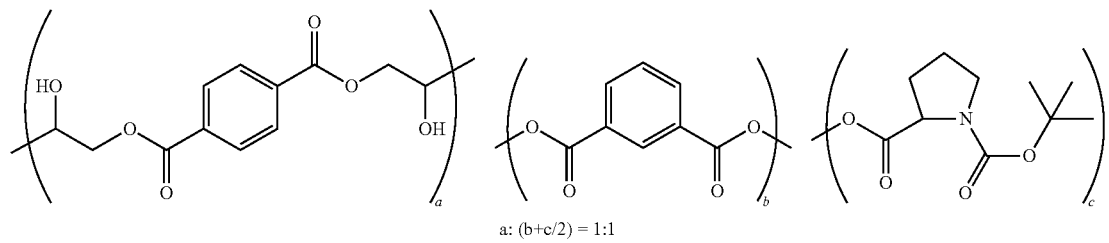
(14-a)

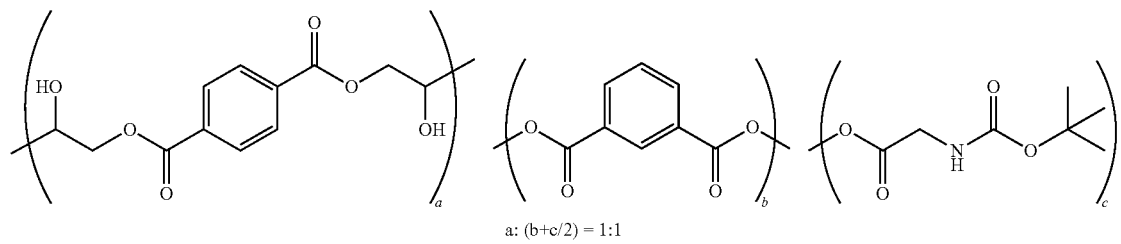
(14-b)

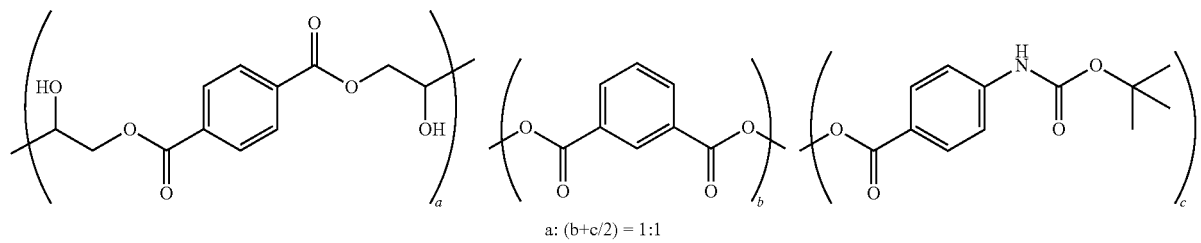
(14-c)

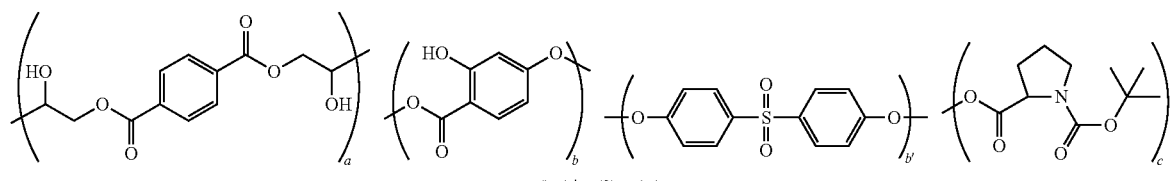
(14-d)

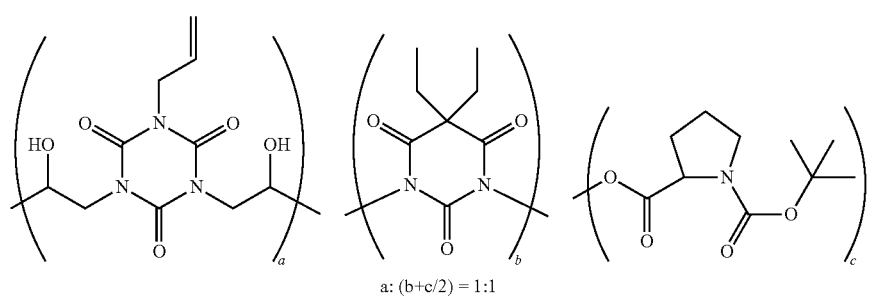
(14-e)

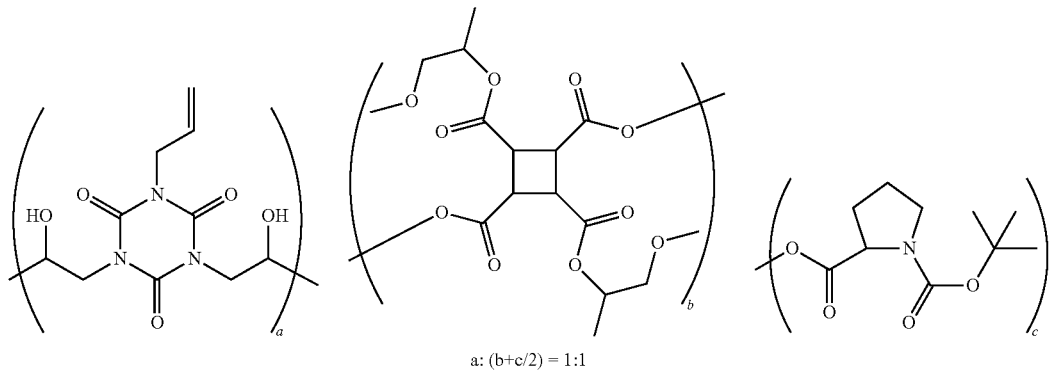

(14-f)

a: (b+c/2) = 1:1 but not limited thereto.

A polymer having the structural units and the end of Formula (14-a) can be obtained by polymerizing the compound of Formula (11-i), the compound of Formula (12-a), and the compound of Formula (13-a) as raw materials. A polymer having the structural units and the end of Formula (14-d) can be obtained by polymerizing the compound of Formula (11-i), the compound of Formula (12-a), the compound of Formula (13-c), and the compound of Formula (13-d) as raw materials.

In Formula (14-a), Formula (14-b), Formula (14-c), Formula (14-e), and Formula (14-f), a molar ratio of a structural unit of a, a structural unit of b, and a structural unit of c satisfy the equation of "a:(b+(c/2))=1:1." In Formula (14-d), a molar ratio of a structural unit of a, a structural unit of b, a structural unit of b', and a structural unit of c satisfy the equation of "a:(b+b'+(c/2))=1:1."

In the molar ratio of "a:(b+(c/2))=1:1" for Formula (14-a), Formula (14-b), Formula (14-c), Formula (14-e), and Formula (14-f), a molar ratio of b and c can be represented by the equation of "b:(c/2)=(1−x):x." In the molar ratio of "a:(b+b'+(c/2))=1:1" for Formula (14-d), a molar ratio of b, b', and c can be represented by the equation of "(b+b'):(c/2)=(1−x):x." Note that a molar ratio x is 0.01 to 0.8, and is preferably 0.1 to 0.3.

Examples of an organic solvent contained in a resist underlayer film-forming composition of the present invention include propylene glycol monomethyl ether (PGME), propylene glycol monomethyl ether acetate (PGMEA), propylene glycol monoethyl ether, propylene glycol monopropyl ether, methyl ethyl ketone, ethyl lactate, cyclohexanone, γ-butyrolactone, N-methylpyrrolidone, and a mixture of two or more solvents selected from these organic solvents. The percentage of a solvent in a resist underlayer film-forming composition of the present invention is, for example, 50% by mass to 99.9% by mass.

A polymer is contained in a resist underlayer film-forming composition of the present invention, in an amount of, for example, 0.1% by mass to 50% by mass of the amount of the resist underlayer film-forming composition.

A resist underlayer film-forming composition of the present invention optionally contains a cross-linker and a cross-linking catalyst that is a compound facilitating a cross-linking reaction, in addition to a polymer and a solvent. When the solid content is defined as a component obtained by excluding an organic solvent from a resist underlayer film-forming composition of the present invention, the solid content includes a polymer, and additive(s) such as a cross-linker and a cross-linking catalyst added as needed. The percentage of the additive(s) is, for example, 0.1% by mass to 50% by mass, and is preferably 1% by mass to 30% by mass of the solid content of a resist underlayer film-forming composition of the present invention.

Examples of a cross-linker that is contained as an optional component in a resist underlayer film-forming composition of the present invention include hexamethoxymethylmelamine, tetramethoxymethylbenzoguanamine, 1,3,4,6-tetrakis(methoxymethyl)glycoluril (POWDERLINK [registered trademark] 1174), 1,3,4,6-tetrakis(butoxymethyl) glycoluril, 1,3,4,6-tetrakis(hydroxymethyl)glycoluril, 1,3-bis(hydroxymethyl)urea, 1,1,3,3-tetrakis(butoxymethyl) urea, and 1,1,3,3-tetrakis(methoxymethyl)urea. When the cross-linker is used, the content percentage of the cross-linker is, for example, 1% by mass to 50% by mass, and is preferably 5% by mass to 30% by mass of an amount of the polymer.

Examples of a cross-linking catalyst that is contained as an optional component in a resist underlayer film-forming composition of the present invention include sulfonic acid compounds and carboxylic acid compounds, such as p-toluenesulfonic acid, trifluoromethanesulfonic acid, pyridinium-p-toluenesulfonate, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, and hydroxybenzoic acid. When the cross-linking catalyst is used, the content percentage of the cross-linking catalyst is, for example, 0.1% by mass to 50% by mass, and is preferably 1% by mass to 30% by mass of an amount of the cross-linker.

Although a representative substrate used in the method for manufacturing a semiconductor element according to the second aspect of the present invention is a silicon wafer, an SOI (Silicon on Insulator) substrate or compound semiconductor wafers such as gallium arsenide (GaAs), indium phosphide (InP), and gallium phosphide (GaP) can also be used. On the substrate, for example, an insulating film such as a silicon oxide film, a nitrogen-containing silicon oxide film (a SiON film), a carbon-containing silicon oxide film (a SiOC film), or a fluorine-containing silicon oxide film (a SiOF film) is formed as a film to be processed. In this case, a resist underlayer film is formed on the film to be processed.

In a method for manufacturing semiconductor elements of the present invention, a resist solution used for covering a resist underlayer film with a resist may be either positive-type or negative-type, and a chemically amplified resist photosensitive to a KrF excimer laser, an ArF excimer laser, extreme ultraviolet, or an electron beam can be used. An alkali developing solution such as a tetramethylammonium hydroxide (TMAH) aqueous solution can be used as a developing solution used for development after irradiation with the KrF excimer laser, the ArF excimer laser, the extreme ultraviolet, or the electron beam.

Hereinafter, the present invention will specifically be described by reference to Synthesis Examples and Examples; however, the present invention is not limited to descriptions of the Synthesis Examples and the Examples.

Weight average molecular weights of the polymers described in Synthesis Example 1 to Synthesis Example 8 and Synthesis Example 10 to Synthesis Example 19 below of the present specification were measured by gel permeation chromatography (hereinafter, abbreviated as GPC). A GPC device manufactured by Tosoh Corporation was used for measurements, and measuring conditions are as described below.

GPC column: Shodex [registered trademark]-Asahipak [registered trademark] (Showa Denko K.K.)
  Column temperature: 40° C.
  Solvent: N,N-dimethylformamide (DMF)
  Flow rate: 0.6 ml/min
  Standard sample: polystyrene (Tosoh Corporation)

EXAMPLES

Synthesis Example 1

14.00 g of 1,4-terephthalic acid diglycidyl ester (the product name: EX-711 [registered trademark], Nagase ChemteX Corporation), 8.08 g of isophthalic acid, 0.90 g of ethyltriphenylphosphonium bromide, and 91.94 g of propylene glycol monomethyl ether were mixed, and the mixture was heated to reflux for 4 hours with stirring. To the obtained polymer solution, 23 g of a cation exchange resin (the product name: DOWEX [registered trademark] 550A, Muromachi Technos Co., Ltd.) and 23 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 17,800 in terms of standard polystyrene.

Synthesis Example 2

4.00 g of 1,4-terephthalic acid diglycidyl ester (the product name: EX-711 [registered trademark], Nagase ChemteX Corporation), 2.08 g of isophthalic acid, 0.60 g of N-(tert-butoxycarbonyl)-L-proline, 0.26 g of ethyltriphenylphosphonium bromide, and 27.74 g of propylene glycol monomethyl ether were mixed, and the mixture was heated to reflux for 4 hours with stirring. To the obtained polymer solution, 7 g of a cation exchange resin (the product name: DOWEX [registered trademark] 550A, Muromachi Technos Co., Ltd.) and 7 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 9,300 in terms of standard polystyrene.

Synthesis Example 3

4.00 g of 1,4-terephthalic acid diglycidyl ester (the product name: EX-711 [registered trademark], Nagase ChemteX Corporation), 1.96 g of isophthalic acid, 0.90 g of N-(tert-butoxycarbonyl)-L-proline, 0.26 g of ethyltriphenylphosphonium bromide, and 28.47 g of propylene glycol monomethyl ether were mixed, and the mixture was heated to reflux for 4 hours with stirring. To the obtained polymer solution, 7 g of a cation exchange resin (the product name: DOWEX [registered trademark] 550A, Muromachi Technos Co., Ltd.) and 7 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 7,800 in terms of standard polystyrene.

Synthesis Example 4

4.00 g of 1,4-terephthalic acid diglycidyl ester (the product name: EX-711 [registered trademark], Nagase ChemteX Corporation), 1.85 g of isophthalic acid, 1.20 g of N-(tert-butoxycarbonyl)-L-proline, 0.26 g of ethyltriphenylphosphonium bromide, and 29.21 g of propylene glycol monomethyl ether were mixed, and the mixture was heated to reflux for 4 hours with stirring. To the obtained polymer solution, 7 g of a cation exchange resin (the product name: DOWEX [registered trademark] 550A, Muromachi Technos Co., Ltd.) and 7 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 6,000 in terms of standard polystyrene.

Synthesis Example 5

7.00 g of 1,4-terephthalic acid diglycidyl ester (the product name: EX-711 [registered trademark], Nagase ChemteX Corporation), 3.43 g of isophthalic acid, 1.28 g of N-(tert-butoxycarbonyl)-L-glycine, 0.45 g of ethyltriphenylphosphonium bromide, and 48.66 g of propylene glycol monomethyl ether were mixed, and the mixture was heated to reflux for 4 hours with stirring. To the obtained polymer solution, 12 g of a cation exchange resin (the product name: DOWEX [registered trademark] 550A, Muromachi Technos Co., Ltd.) and 12 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 6,800 in terms of standard polystyrene.

Synthesis Example 6

7.00 g of 1,4-terephthalic acid diglycidyl ester (the product name: EX-711 [registered trademark], Nagase ChemteX Corporation), 3.43 g of isophthalic acid, 1.69 g of N-(tert-butoxycarbonyl)-L-leucine, 0.45 g of ethyltriphenylphosphonium bromide, and 50.29 g of propylene glycol monomethyl ether were mixed, and the mixture was heated to reflux for 4 hours with stirring. To the obtained polymer solution, 12 g of a cation exchange resin (the product name: DOWEX [registered trademark] 550A, Muromachi Technos Co., Ltd.) and 12 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 7,800 in terms of standard polystyrene.

Synthesis Example 7

7.00 g of 1,4-terephthalic acid diglycidyl ester (the product name: EX-711 [registered trademark], Nagase ChemteX Corporation), 3.43 g of isophthalic acid, 1.50 g of N-(tert-butoxycarbonyl)-L-serine, 0.45 g of ethyltriphenylphosphonium bromide, and 49.53 g of propylene glycol monomethyl ether were mixed, and the mixture was heated to reflux for 4 hours with stirring. To the obtained polymer solution, 12 g of a cation exchange resin (the product name: DOWEX [registered trademark] 550A, Muromachi Technos Co., Ltd.) and 12 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 6,200 in terms of standard polystyrene.

Synthesis Example 8

7.00 g of 1,4-terephthalic acid diglycidyl ester (the product name: EX-711 [registered trademark], Nagase ChemteX Corporation), 3.43 g of isophthalic acid, 1.69 g of trans-N-(tert-butoxycarbonyl)-4-hydroxy-L-proline, 0.45 g of ethyltriphenylphosphonium bromide, and 50.29 g of propylene glycol monomethyl ether were mixed, and the mixture was heated to reflux for 4 hours with stirring. To the obtained polymer solution, 12 g of a cation exchange resin (the product name: DOWEX [registered trademark] 550A, Muromachi Technos Co., Ltd.) and 12 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 8,500 in terms of standard polystyrene.

Synthesis Example 9

80 mL of 1,4-dioxane and an aqueous solution prepared by dissolving 1.46 g of sodium hydroxide in 80 mL of water were added to 5.00 g of 4-aminobenzoic acid. After 11.94 g of di(tert-butyl)dicarbonate was further added thereto, the mixture was stirred at room temperature for 19 hours. A saturated citric acid aqueous solution was added to the reaction solution until the solution became acidic, and a deposited solid was filtrated. The residue was dried under vacuum to obtain 6.24 g of 4-(tert-butoxycarbonyl)aminobenzoic acid with the yield of 72%.

Synthesis Example 10

5.00 g of 1,4-terephthalic acid diglycidyl ester (the product name: EX-711 [registered trademark], Nagase ChemteX Corporation), 2.45 g of isophthalic acid, 1.24 g of 4-(tert-butoxycarbonyl)aminobenzoic acid obtained in Synthesis Example 9, 0.32 g of ethyltriphenylphosphonium bromide, and 36.05 g of propylene glycol monomethyl ether were mixed, and the mixture was heated to reflux for 4 hours with stirring. To the obtained polymer solution, 8 g of a cation exchange resin (the product name: DOWEX [registered trademark] 550A, Muromachi Technos Co., Ltd.) and 8 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 9,300 in terms of standard polystyrene.

Synthesis Example 11

12.00 g of 1,4-terephthalic acid diglycidyl ester (the product name: EX-711 [registered trademark], Nagase ChemteX Corporation), 3.21 g of 2,4-dihydroxybenzoic acid, 5.22 g of bis(4-hydroxyphenyl)sulfone, 0.77 g of ethyltriphenylphosphonium bromide, and 84.82 g of propylene glycol monomethyl ether were mixed, and the mixture was heated to reflux for 4 hours with stirring. To the obtained polymer solution, 22 g of a cation exchange resin (the product name: DOWEX [registered trademark] 550A, Muromachi Technos Co., Ltd.) and 22 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 5,500 in terms of standard polystyrene.

Synthesis Example 12

12.00 g of 1,4-terephthalic acid diglycidyl ester (the product name: EX-711 [registered trademark], Nagase ChemteX Corporation), 3.05 g of 2,4-dihydroxybenzoic acid, 4.96 g of bis(4-hydroxyphenyl)sulfone, 0.90 g of N-(tert-butoxycarbonyl)-L-proline, 0.77 g of ethyltriphenylphosphonium bromide, and 86.72 g of propylene glycol monomethyl ether were mixed, and the mixture was heated to reflux for 4 hours with stirring. To the obtained polymer solution, 22 g of a cation exchange resin (the product name: DOWEX [registered trademark] 550A, Muromachi Technos Co., Ltd.) and 22 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 4,100 in terms of standard polystyrene.

Synthesis Example 13

12.00 g of 1,4-terephthalic acid diglycidyl ester (the product name: EX-711 [registered trademark], Nagase ChemteX Corporation), 2.89 g of 2,4-dihydroxybenzoic acid, 4.70 g of bis(4-hydroxyphenyl)sulfone, 1.79 g of N-(tert-butoxycarbonyl)-L-proline, 0.77 g of ethyltriphenylphosphonium bromide, and 88.62 g of propylene glycol monomethyl ether were mixed, and the mixture was heated to reflux for 4 hours with stirring. To the obtained polymer solution, 22 g of a cation exchange resin (the product name: DOWEX [registered trademark] 550A, Muromachi Technos Co., Ltd.) and 22 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 3,200 in terms of standard polystyrene.

Synthesis Example 14

13.00 g of monoallyl diglycidyl isocyanurate (the product name: MA-DGIC, SHIKOKU CHEMICALS CORPORA- TION), 8.65 g of 5,5-diethylbarbiturate, 0.53 g of benzyltriethylammonium chloride, and 88.72 g of propylene glycol monomethyl ether were mixed, and the mixture was heated to reflux for 4 hours with stirring. To the obtained polymer solution, 22 g of a cation exchange resin (the product name: DOWEX [registered trademark] 550A, Muromachi Technos Co., Ltd.) and 22 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 8,000 in terms of standard polystyrene.

Synthesis Example 15

13.00 g of monoallyl diglycidyl isocyanurate (the product name: MA-DGIC, SHIKOKU CHEMICALS CORPORATION), 8.21 g of 5,5-diethylbarbiturate, 1.01 g of N-(tert-butoxycarbonyl)-L-proline, 0.53 g of benzyltriethylammonium chloride, and 91.03 g of propylene glycol monomethyl ether were mixed, and the mixture was heated to reflux for 4 hours with stirring. To the obtained polymer solution, 22 g of a cation exchange resin (the product name: DOWEX [registered trademark] 550A, Muromachi Technos Co., Ltd.) and 22 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 4,500 in terms of standard polystyrene.

Synthesis Example 16

13.00 g of monoallyl diglycidyl isocyanurate (the product name: MA-DGIC, SHIKOKU CHEMICALS CORPORATION), 7.78 g of 5,5-diethylbarbiturate, 2.02 g of N-(tert-butoxycarbonyl)-L-proline, 0.53 g of benzyltriethylammonium chloride, and 93.34 g of propylene glycol monomethyl ether were mixed, and the mixture was heated to reflux for 4 hours with stirring. To the obtained polymer solution, 22 g of a cation exchange resin (the product name: DOWEX [registered trademark] 550A, Muromachi Technos Co., Ltd.) and 22 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 3,500 in terms of standard polystyrene.

Synthesis Example 17

6.00 g of monoallyl diglycidyl isocyanurate (the product name: MA-DGIC, SHIKOKU CHEMICALS CORPORATION), 4.25 g of 1,2,3,4-cyclobutanetetracarboxylic acid dianhydride, 0.25 g of benzyltriethylammonium chloride, and 41.98 g of propylene glycol monomethyl ether were mixed, and the mixture was heated to reflux for 4 hours with stirring. To the obtained polymer solution, 10 g of a cation exchange resin (the product name: DOWEX [registered trademark] 550A, Muromachi Technos Co., Ltd.) and 10 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 10,000 in terms of standard polystyrene.

Synthesis Example 18

7.00 g of monoallyl diglycidyl isocyanurate (the product name: MA-DGIC, SHIKOKU CHEMICALS CORPORATION), 4.71 g of 1,2,3,4-cyclobutanetetracarboxylic acid dianhydride, 0.54 g of N-(tert-butoxycarbonyl)-L-proline, 0.29 g of benzyltriethylammonium chloride, and 50.16 g of propylene glycol monomethyl ether were mixed, and the mixture was heated to reflux for 4 hours with stirring. To the obtained polymer solution, 12 g of a cation exchange resin (the product name: DOWEX [registered trademark] 550A, Muromachi Technos Co., Ltd.) and 12 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 12,000 in terms of standard polystyrene.

Synthesis Example 19

7.00 g of monoallyl diglycidyl isocyanurate (the product name: MA-DGIC, SHIKOKU CHEMICALS CORPORATION), 4.46 g of 1,2,3,4-cyclobutanetetracarboxylic acid dianhydride, 1.09 g of N-(tert-butoxycarbonyl)-L-proline, 0.29 g of benzyltriethylammonium chloride, and 51.35 g of propylene glycol monomethyl ether were mixed, and the mixture was heated to reflux for 4 hours with stirring. To the obtained polymer solution, 12 g of a cation exchange resin (the product name: DOWEX [registered trademark] 550A, Muromachi Technos Co., Ltd.) and 12 g of an anion exchange resin (the product name: Amberlite [registered trademark] 15JWET, Organo Corporation) were added, and the mixture was subjected to an ion exchange process at room temperature for 4 hours. The result of GPC analysis showed that the weight average molecular weight of the obtained polymer solution was 9,300 in terms of standard polystyrene.

Example 1

2.50 g of the polymer solution obtained in Synthesis Example 2, 0.11 g of tetramethoxymethylglycoluril (the product name: POWDERLINK [registered trademark] 1174, manufactured by Nihon Cytec Industries Inc.), 0.01 g of 5-sulfosalicylic acid, 37.93 g of propylene glycol monomethyl ether, and 17.14 g of propylene glycol monomethyl ether acetate were mixed to prepare a resist underlayer film-forming composition.

Example 2

2.50 g of the polymer solution obtained in Synthesis Example 3, 0.11 g of tetramethoxymethylglycoluril (the product name: POWDERLINK [registered trademark] 1174, manufactured by Nihon Cytec Industries Inc.), 0.01 g of 5-sulfosalicylic acid, 38.16 g of propylene glycol monomethyl ether, and 17.23 g of propylene glycol monomethyl ether acetate were mixed to prepare a resist underlayer film-forming composition.

Example 3

2.50 g of the polymer solution obtained in Synthesis Example 4, 0.12 g of tetramethoxymethylglycoluril (the product name: POWDERLINK [registered trademark] 1174, manufactured by Nihon Cytec Industries Inc.), 0.01 g of 5-sulfosalicylic acid, 38.96 g of propylene glycol monomethyl ether, and 17.57 g of propylene glycol monomethyl ether acetate were mixed to prepare a resist underlayer film-forming composition.

Example 4

2.50 g of the polymer solution obtained in Synthesis Example 5, 0.10 g of tetramethoxymethylglycoluril (the product name: POWDERLINK [registered trademark] 1174, manufactured by Nihon Cytec Industries Inc.), 0.01 g of 5-sulfosalicylic acid, 33.78 g of propylene glycol monomethyl ether, and 15.37 g of propylene glycol monomethyl ether acetate were mixed to prepare a resist underlayer film-forming composition.

Example 5

2.50 g of the polymer solution obtained in Synthesis Example 6, 0.10 g of tetramethoxymethylglycoluril (the product name: POWDERLINK [registered trademark] 1174, manufactured by Nihon Cytec Industries Inc.), 0.01 g of 5-sulfosalicylic acid, 33.11 g of propylene glycol monomethyl ether, and 15.09 g of propylene glycol monomethyl ether acetate were mixed to prepare a resist underlayer film-forming composition.

Example 6

2.50 g of the polymer solution obtained in Synthesis Example 7, 0.10 g of tetramethoxymethylglycoluril (the product name: POWDERLINK [registered trademark] 1174, manufactured by Nihon Cytec Industries Inc.), 0.01 g of 5-sulfosalicylic acid, 34.27 g of propylene glycol monomethyl ether, and 15.58 g of propylene glycol monomethyl ether acetate were mixed to prepare a resist underlayer film-forming composition.

Example 7

2.50 g of the polymer solution obtained in Synthesis Example 8, 0.10 g of tetramethoxymethylglycoluril (the product name: POWDERLINK [registered trademark] 1174, manufactured by Nihon Cytec Industries Inc.), 0.01 g of 5-sulfosalicylic acid, 34.67 g of propylene glycol monomethyl ether, and 15.75 g of propylene glycol monomethyl ether acetate were mixed to prepare a resist underlayer film-forming composition.

Example 8

2.50 g of the polymer solution obtained in Synthesis Example 10, 0.10 g of tetramethoxymethylglycoluril (the product name: POWDERLINK [registered trademark] 1174, manufactured by Nihon Cytec Industries Inc.), 0.01 g of 5-sulfosalicylic acid, 43.89 g of propylene glycol monomethyl ether, and 5.11 g of propylene glycol monoethyl ether were mixed to prepare a resist underlayer film-forming composition.

Comparative Example 1

2.50 g of the polymer solution obtained in Synthesis Example 1, 0.11 g of tetramethoxymethylglycoluril (the product name: POWDERLINK [registered trademark] 1174, manufactured by Nihon Cytec Industries Inc.), 0.01 g of 5-sulfosalicylic acid, 46.21 g of propylene glycol monomethyl ether, and 5.36 g of propylene glycol monoethyl ether were mixed to prepare a resist underlayer film-forming composition.

Example 9

2.50 g of the polymer solution obtained in Synthesis Example 12, 0.11 g of tetramethoxymethylglycoluril (the product name: POWDERLINK [registered trademark] 1174, manufactured by Nihon Cytec Industries Inc.), 0.01 g of 5-sulfosalicylic acid, 36.39 g of propylene glycol monomethyl ether, and 16.48 g of propylene glycol monomethyl ether acetate were mixed to prepare a resist underlayer film-forming composition.

Example 10

2.50 g of the polymer solution obtained in Synthesis Example 13, 0.11 g of tetramethoxymethylglycoluril (the product name: POWDERLINK [registered trademark] 1174, manufactured by Nihon Cytec Industries Inc.), 0.01 g of 5-sulfosalicylic acid, 37.13 g of propylene glycol monomethyl ether, and 16.79 g of propylene glycol monomethyl ether acetate were mixed to prepare a resist underlayer film-forming composition.

Comparative Example 2

2.00 g of the polymer solution obtained in Synthesis Example 11, 0.10 g of tetramethoxymethylglycoluril (the product name: POWDERLINK [registered trademark] 1174, manufactured by Nihon Cytec Industries Inc.), 0.01 g of 5-sulfosalicylic acid, 32.72 g of propylene glycol monomethyl ether, and 14.72 g of propylene glycol monomethyl ether acetate were mixed to prepare a resist underlayer film-forming composition.

Example 11

2.50 g of the polymer solution obtained in Synthesis Example 15, 0.10 g of tetramethoxymethylglycoluril (the product name: POWDERLINK [registered trademark] 1174, manufactured by Nihon Cytec Industries Inc.), 0.01 g of 5-sulfosalicylic acid, 32.44 g of propylene glycol monomethyl ether, and 14.81 g of propylene glycol monomethyl ether acetate were mixed to prepare a resist underlayer film-forming composition.

Example 12

2.50 g of the polymer solution obtained in Synthesis Example 16, 0.10 g of tetramethoxymethylglycoluril (the product name: POWDERLINK [registered trademark] 1174, manufactured by Nihon Cytec Industries Inc.), 0.01 g of 5-sulfosalicylic acid, 33.04 g of propylene glycol monomethyl ether, and 15.06 g of propylene glycol monomethyl ether acetate were mixed to prepare a resist underlayer film-forming composition.

Comparative Example 3

2.50 g of the polymer solution obtained in Synthesis Example 14, 0.11 g of tetramethoxymethylglycoluril (the product name: POWDERLINK [registered trademark] 1174, manufactured by Nihon Cytec Industries Inc.), 0.01 g of 5-sulfosalicylic acid, 35.70 g of propylene glycol monomethyl ether, and 16.19 g of propylene glycol monomethyl ether acetate were mixed to prepare a resist underlayer film-forming composition.

Example 13

2.00 g of the polymer solution obtained in Synthesis Example 18, 0.11 g of tetramethoxymethylglycoluril (the product name: POWDERLINK [registered trademark] 1174, manufactured by Nihon Cytec Industries Inc.), 0.01 g of 5-sulfosalicylic acid, 37.85 g of propylene glycol monomethyl ether, and 16.89 g of propylene glycol monomethyl ether acetate were mixed to prepare a resist underlayer film-forming composition.

Example 14

2.00 g of the polymer solution obtained in Synthesis Example 19, 0.11 g of tetramethoxymethylglycoluril (the product name: POWDERLINK [registered trademark] 1174, manufactured by Nihon Cytec Industries Inc.), 0.01 g of 5-sulfosalicylic acid, 36.42 g of propylene glycol monomethyl ether, and 16.28 g of propylene glycol monomethyl ether acetate were mixed to prepare a resist underlayer film-forming composition.

Comparative Example 4

2.00 g of the polymer solution obtained in Synthesis Example 17, 0.12 g of tetramethoxymethylglycoluril (the product name: POWDERLINK [registered trademark] 1174, manufactured by Nihon Cytec Industries Inc.), 0.01 g of 5-sulfosalicylic acid, 40.34 g of propylene glycol monomethyl ether, and 17.94 g of propylene glycol monomethyl ether acetate were mixed to prepare a resist underlayer film-forming composition.

(Formation and Evaluation of Resist Pattern)

The resist underlayer film-forming compositions prepared in Examples 1 to 14 and Comparative Examples 1 to 4 of the present specification were each spin-coated onto a corresponding silicon wafer on which a nitrogen-containing silicon oxide film (SiON) had been evaporated (31.5 nm of the film thickness) such that the film thickness of the spin-coated composition would be 10 nm, and then the spin-coated composition was heated at 205° C. for 60 seconds to form a resist underlayer film. A positive-type resist solution for ArF excimer lasers (manufactured by JSR Corporation, the product name: AR2772JN) was spin-coated onto the resist underlayer film and heated at 110° C. for 90 seconds, and then exposed under a given condition by using an exposure device for ArF excimer lasers (manufactured by Nikon Corporation, NSR-S307E). After the exposure, the resist was heated at 110° C. for 90 seconds (PEB), cooled to room temperature on a cooling plate, developed, and rinsed to form a resist pattern.

The desired line width was set to be 80 nm line and space (lines of 80 nm of and spaces of 100 nm), and the maximum amount of exposure at which a resist pattern does not collapse (the limit exposure amount) and the dimension of a resist pattern at the maximum amount of exposure (the limit dimension of pattern collapse) were determined by a length measuring SEM in order to investigate a relation between the change in an exposure amount and collapse of a resist pattern at the optimum focus. According to this, it can be determined whether the use of a resist underlayer film-forming composition according to the present invention prevents collapse of a resist pattern within a range of high exposure amounts and forms a fine resist pattern. The cross sectional shape of a resist pattern at 80 nm line and space, which was the desired line width, was observed by a cross sectional SEM. Accordingly, a resist shape causing collapse of a resist pattern can be identified by using a resist underlayer film-forming composition according to the present invention.

The limit exposure amount, the limit dimension of pattern collapse, and the cross sectional shape of the obtained resist pattern are shown in Tables 1 to 4 below. Larger values are preferable for the limit exposure amount, and smaller values are preferable for the limit dimension of pattern collapse, which means collapse of a resist pattern is unlikely and high adhesiveness between a resist underlayer film and a resist pattern is achieved.

TABLE 1

| Resist Underlayer Film-Forming Composition | Limit Exposure Amount | Limit Dimension of Pattern Collapse | Cross Sectional Shape of Pattern |
|---|---|---|---|
| Example 1 | 35 mJ/cm$^2$ | 53.30 nm | Taper |
| Example 2 | 36.5 mJ/cm$^2$ | 55.20 nm | Taper |
| Example 3 | 36.5 mJ/cm$^2$ | 60.27 nm | Taper |
| Example 4 | 36.5 mJ/cm$^2$ | 56.23 nm | Taper |
| Example 5 | 35 mJ/cm$^2$ | 57.11 nm | Taper |
| Example 6 | 35 mJ/cm$^2$ | 52.77 nm | Taper |
| Example 7 | 35 mJ/cm$^2$ | 54.52 nm | Taper |
| Example 8 | 33.5 mJ/cm$^2$ | 46.89 nm | Taper |
| Comparative Example 1 | 27.5 mJ/cm$^2$ | 70.38 nm | Undercut |

TABLE 2

| Resist Underlayer Film-Forming Composition | Limit Exposure Amount | Limit Dimension of Pattern Collapse | Cross Sectional Shape of Pattern |
|---|---|---|---|
| Example 9 | 33.5 mJ/cm$^2$ | 54.42 nm | Taper |
| Example 10 | 35 mJ/cm$^2$ | 53.87 nm | Taper |
| Comparative Example 2 | 29 mJ/cm$^2$ | 62.64 nm | Undercut |

TABLE 3

| Resist Underlayer Film-Forming Composition | Limit Exposure Amount | Limit Dimension of Pattern Collapse | Cross Sectional Shape of Pattern |
|---|---|---|---|
| Example 11 | 35 mJ/cm$^2$ | 53.51 nm | Taper |
| Example 12 | 38 mJ/cm$^2$ | 52.75 nm | Taper |
| Comparative Example 3 | 32 mJ/cm$^2$ | 55.61 nm | Straight |

TABLE 4

| Resist Underlayer Film-Forming Composition | Limit Exposure Amount | Limit Dimension of Pattern Collapse | Cross Sectional Shape of Pattern |
|---|---|---|---|
| Example 13 | 35 mJ/cm$^2$ | 49.99 nm | Taper |
| Example 14 | 38 mJ/cm$^2$ | 51.76 nm | Taper |
| Comparative Example 4 | 33.5 mJ/cm$^2$ | 52.48 nm | Taper |

The results shown in Table 1 indicate that, when resist underlayer films were each formed with the resist underlayer film-forming compositions of Examples 1 to 8, a limit exposure amount was larger, and a pattern collapse limit dimension was lower compared to when a resist underlayer film was formed with the resist underlayer film-forming composition of Comparative Example 1. Thus, by using the resist underlayer film-forming compositions of Examples 1 to 8, collapse of resist patterns can be prevented when fine resist patterns are formed. When resist underlayer films were each formed with the resist underlayer film-forming compositions of Examples 1 to 8, each of the cross sectional shapes of the obtained resist patterns was a tapered shape (trapezoidal shape). On the other hand, when a resist underlayer film was formed with the resist underlayer film-forming composition of Comparative Example 1, the cross sectional shape of the obtained resist pattern was an undercut shape. In the taper shape, the contact area between a resist pattern and a resist underlayer film increased, and thus collapse of a resist pattern can be prevented. Similarly, the results shown in Tables 2 to 4 indicate that, when Example 9 and Example 10 are compared to Comparative Example 2; Example 11 and Example 12 are compared to Comparative Example 3; and Example 13 and Example 14 are compared to Comparative Example 4; the resist underlayer films formed by using any of the resist underlayer film-forming compositions of Examples showed larger limit exposure amounts, and lower limit dimensions of pattern collapse compared to those formed by using any of the resist underlayer film-forming compositions of Comparative Examples. To conclude, it was confirmed that the resist underlayer film-forming compositions of Examples 1 to 14 effectively prevented collapse of resist patterns.

Although the embodiments of the present invention were described above, the technical scope of the present invention is not limited to these embodiments, and a variety of changes and improvements can be applied thereto.

The invention claimed is:

1. A resist underlayer film-forming composition for lithography, comprising:
a polymer that has a structure of Formula (1a), Formula (1b), or Formula (2) below on an end of the polymer; and an organic solvent:

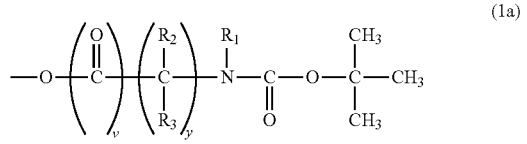

(1a)

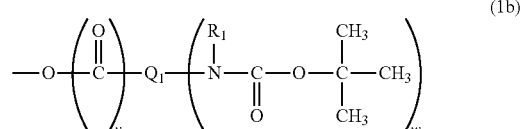

(1b)

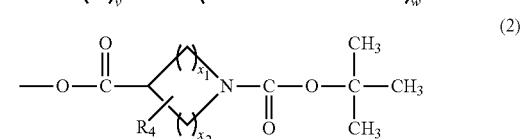

(2)

where $R_1$ is a hydrogen atom or a methyl group; each of $R_2$ and $R_3$ is independently a hydrogen atom, a linear or branched hydrocarbon group having a carbon atom number of 1 to 6, an alicyclic hydrocarbon group, a phenyl group, a benzyl group, a benzyloxy group, a benzylthio group, an imidazole group, or an indole group; each of the hydrocarbon group, the alicyclic hydrocarbon group, the phenyl group, the benzyl group, the benzyloxy group, the benzylthio group, the imidazole group, and the indole group optionally has at least one of a hydroxy group and a methylthio group as substituent(s); $R_4$ is a hydrogen atom or a hydroxy group; $Q_1$ is an arylene group; v is 0 or 1; y is an integer of 1 to 4; w is an integer of 1 to 4; $x_1$ is 0 or 1; and $x_2$ is an integer of 1 to 5,
wherein the polymer further has at least one of structure units represented by Formula (4) in a main chain of the polymer:

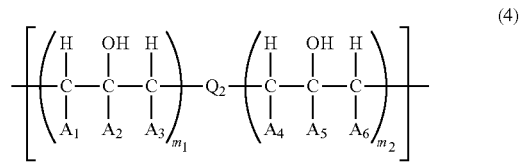

(4)

where each of $A_1$, $A_2$, $A_3$, $A_4$, $A_5$, and $A_6$ is independently a hydrogen atom, a methyl group, or an ethyl group; each of $m_1$ and $m_2$ is independently 0 or 1; and $Q_2$ is a divalent organic group of Formula (6):

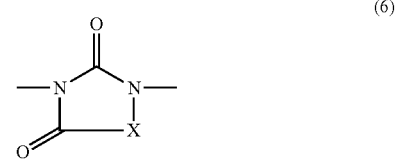

(6)

where X is a divalent organic group of Formula (7) or Formula (8):

(7)

(8)

where each of $R_6$ and $R_7$ is independently a hydrogen atom, a $C_{1-6}$ alkyl group, a $C_{3-6}$ alkenyl group, a benzyl group, or a phenyl group, in which the phenyl group is optionally substituted with at least one selected from the group consisting of a $C_{1-6}$ alkyl group, a halogen atom, a $C_{1-6}$ alkoxy group, a nitro group, a cyano group, and a $C_{1-6}$ alkylthio group; or $R_6$ and $R_7$ are optionally bonded to each other to form a $C_{3-6}$ ring, together with a carbon atom bonded to $R_6$ and $R_7$.

2. The resist underlayer film-forming composition for lithography according to claim 1, wherein
the structure of Formula (1b) is Formula (3):

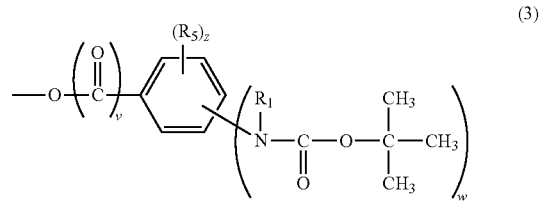

(3)

where $R_1$ is as defined in Formula (1b); each $R_5$ is independently a hydrogen atom, a linear or branched hydrocarbon group having a carbon atom number of 1 to 6, a $C_{1-4}$ alkoxy group, a $C_{1-4}$ alkylthio group, a halogen atom, a cyano group, or a nitro group; v and w are as defined in Formula (1b); and z is an integer of (5−w).

3. The resist underlayer film-forming composition for lithography according to claim 1, further comprising a cross-linker and a cross-linking catalyst.

4. A method for producing a semiconductor element, the method comprising:
applying the resist underlayer film-forming composition as claimed in claim 1 onto a substrate having a film to be processed;
baking the applied resist underlayer film-forming composition to form a resist underlayer film;
covering the resist underlayer film with a resist;
irradiating the substrate covered with the resist with a KrF excimer laser, an ArF excimer laser, an extreme ultraviolet, or an electron beam;
forming a resist pattern by development; and
patterning the film to be processed by dry etching using the resist pattern as a mask.

5. A resist underlayer film-forming composition for lithography, comprising:
a polymer that has a structure of Formula (1a), Formula (1b), or Formula (2) below on an end of the polymer; and
an organic solvent:

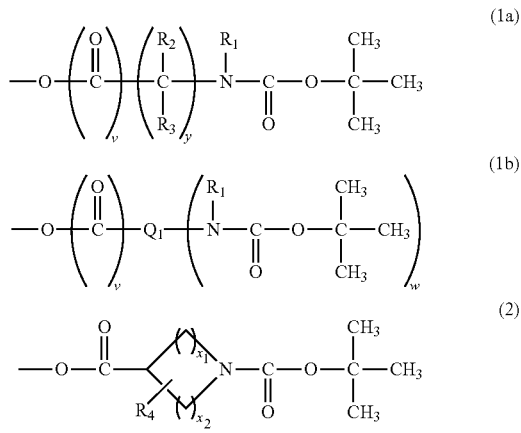

where $R_1$ is a hydrogen atom or a methyl group; each of $R_2$ and $R_3$ is independently a hydrogen atom, a linear or branched hydrocarbon group having a carbon atom number of 1 to 6, an alicyclic hydrocarbon group, a phenyl group, a benzyl group, a benzyloxy group, a benzylthio group, an imidazole group, or an indole group; each of the hydrocarbon group, the alicyclic hydrocarbon group, the phenyl group, the benzyl group, the benzyloxy group, the benzylthio group, the imidazole group, and the indole group optionally has at least one of a hydroxy group and a methylthio group as substituent(s); $R_4$ is a hydrogen atom or a hydroxy group; $Q_1$ is an arylene group; v is 0 or 1; y is an integer of 1 to 4; w is an integer of 1 to 4; $x_1$ is 0 or 1; and $x_2$ is an integer of 1 to 5,
wherein the polymer further has at least one of structure units represented by Formula (4) in a main chain of the polymer:

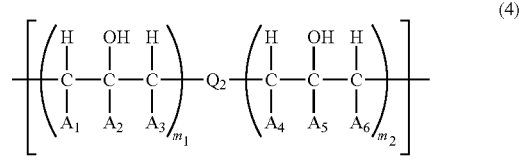

where each of $A_1$, $A_2$, $A_3$, $A_4$, $A_5$, and $A_6$ is independently a hydrogen atom, a methyl group, or an ethyl group; each of $m_1$ and $m_2$ is independently 0 or 1; and $Q_2$ is a divalent organic group of Formula (9):

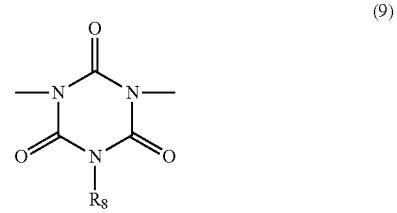

where $R_8$ is a $C_{1-6}$ alkyl group, a $C_{3-6}$ alkenyl group, a benzyl group, or a phenyl group, in which the phenyl group is optionally substituted with at least one selected from the group consisting of a $C_{1-6}$ alkyl group, a halogen atom, a $C_{1-6}$ alkoxy group, a nitro group, a cyano group, and a $C_{1-6}$ alkylthio group.

6. The resist underlayer film-forming composition for lithography according to claim 5, wherein
the structure of Formula (1b) is Formula (3):

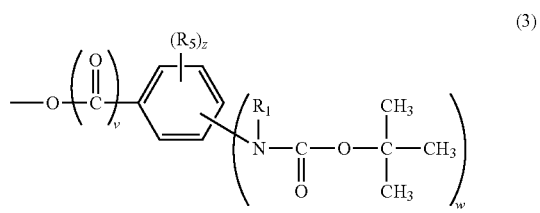

where $R_1$ is as defined in Formula (1b); each $R_5$ is independently a hydrogen atom, a linear or branched hydrocarbon group having a carbon atom number of 1 to 6, a $C_{1-4}$ alkoxy group, a $C_{1-4}$ alkylthio group, a halogen atom, a cyano group, or a nitro group; v and w are as defined in Formula (1b); and z is an integer of (5−w).

7. The resist underlayer film-forming composition for lithography according to claim 5, further comprising a cross-linker and a cross-linking catalyst.

8. A method for producing a semiconductor element, the method comprising:
applying the resist underlayer film-forming composition as claimed in claim 5 onto a substrate having a film to be processed;
baking the applied resist underlayer film-forming composition to form a resist underlayer film;
covering the resist underlayer film with a resist;
irradiating the substrate covered with the resist with a KrF excimer laser, an ArF excimer laser, an extreme ultraviolet, or an electron beam;
forming a resist pattern by development; and
patterning the film to be processed by dry etching using the resist pattern as a mask.

9. A resist underlayer film-forming composition for lithography, comprising:
a polymer that has a structure of Formula (1a), Formula (1b), or Formula (2) below on an end of the polymer;
an organic solvent;
a cross-linker; and
a cross-linking catalyst:

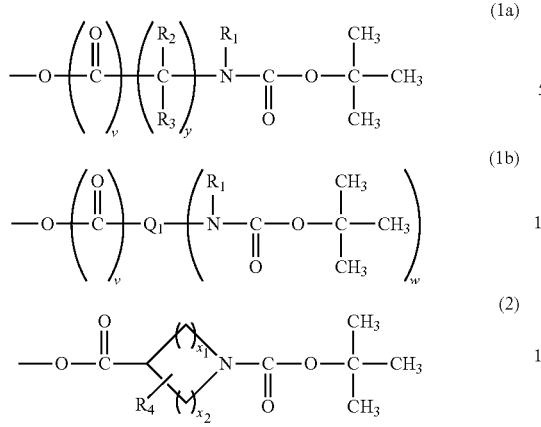

where $R_1$ is a hydrogen atom or a methyl group; each of $R_2$ and $R_3$ is independently a hydrogen atom, a linear or branched hydrocarbon group having a carbon atom number of 1 to 6, an alicyclic hydrocarbon group, a phenyl group, a benzyl group, a benzyloxy group, a benzylthio group, an imidazole group, or an indole group; each of the hydrocarbon group, the alicyclic hydrocarbon group, the phenyl group, the benzyl group, the benzyloxy group, the benzylthio group, the imidazole group, and the indole group optionally has at least one of a hydroxy group and a methylthio group as substituent(s); $R_4$ is a hydrogen atom or a hydroxy group; $Q_1$ is an arylene group; v is 0 or 1; y is an integer of 1 to 4; w is an integer of 1 to 4; $x_1$ is 0 or 1; and $x_2$ is an integer of 1 to 5.

10. The resist underlayer film-forming composition for lithography according to claim 9, wherein
the structure of Formula (1b) is Formula (3):

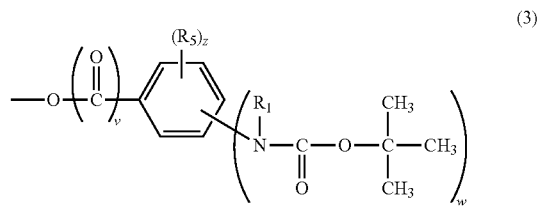

where $R_1$ is as defined in Formula (1b); each $R_5$ is independently a hydrogen atom, a linear or branched hydrocarbon group having a carbon atom number of 1 to 6, a $C_{1-4}$ alkoxy group, a $C_{1-4}$ alkylthio group, a halogen atom, a cyano group, or a nitro group; v and w are as defined in Formula (1b); and z is an integer of (5−w).

11. A method for producing a semiconductor element, the method comprising:
applying the resist underlayer film-forming composition as claimed in claim 9 onto a substrate having a film to be processed;
baking the applied resist underlayer film-forming composition to form a resist underlayer film;
covering the resist underlayer film with a resist;
irradiating the substrate covered with the resist with a KrF excimer laser, an ArF excimer laser, an extreme ultraviolet, or an electron beam;
forming a resist pattern by development; and
patterning the film to be processed by dry etching using the resist pattern as a mask.

12. A method for producing a semiconductor element, the method comprising:
applying a resist underlayer film-forming composition onto a substrate having a film to be processed;
baking the applied resist underlayer film-forming composition to form a resist underlayer film;
covering the resist underlayer film with a resist;
irradiating the substrate covered with the resist with a KrF excimer laser, an ArF excimer laser, an extreme ultraviolet, or an electron beam;
forming a resist pattern by development; and
patterning the film to be processed by dry etching using the resist pattern as a mask,
wherein the resist underlayer film-forming composition comprises:
a polymer that has a structure of Formula (1a), Formula (1b), or Formula (2) below on an end of the polymer; and
an organic solvent:

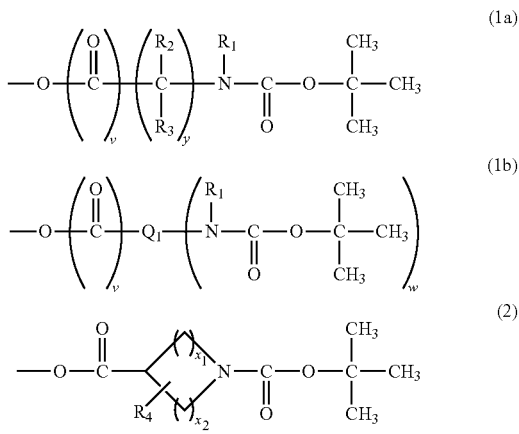

where $R_1$ is a hydrogen atom or a methyl group; each of $R_2$ and $R_3$ is independently a hydrogen atom, a linear or branched hydrocarbon group having a carbon atom number of 1 to 6, an alicyclic hydrocarbon group, a phenyl group, a benzyl group, a benzyloxy group, a benzylthio group, an imidazole group, or an indole group; each of the hydrocarbon group, the alicyclic hydrocarbon group, the phenyl group, the benzyl group, the benzyloxy group, the benzylthio group, the imidazole group, and the indole group optionally has at least one of a hydroxy group and a methylthio group as substituent(s); $R_4$ is a hydrogen atom or a hydroxy group; $Q_1$ is an arylene group; v is 0 or 1; y is an integer of 1 to 4; w is an integer of 1 to 4; $x_1$ is 0 or 1; and $x_2$ is an integer of 1 to 5.

13. The method according to claim 12, wherein
the structure of Formula (1b) is Formula (3):

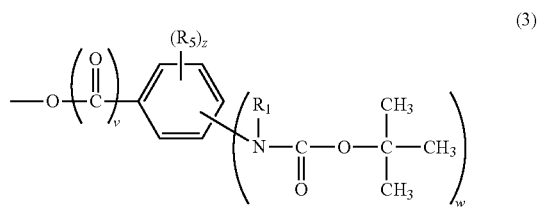

where $R_1$ is as defined in Formula (1b); each $R_5$ is independently a hydrogen atom, a linear or branched hydrocarbon group having a carbon atom number of 1 to 6, a $C_{1-4}$ alkoxy group, a $C_{1-4}$ alkylthio group, a halogen atom, a cyano group, or a nitro group; v and w are as defined in Formula (1b); and z is an integer of (5−w).

* * * * *